US012674829B2

(12) United States Patent
Hirao

(10) Patent No.: US 12,674,829 B2
(45) Date of Patent: Jul. 7, 2026

(54) MEASURING DEVICE FOR CAPACITANCE OF SEMICONDUCTOR DEVICE AND MEASUREMENT JIG

(71) Applicant: Mitsubishi Electric Corporation, Tokyo (JP)

(72) Inventor: Masayoshi Hirao, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 140 days.

(21) Appl. No.: 18/673,708

(22) Filed: May 24, 2024

(65) Prior Publication Data

US 2025/0035689 A1　　Jan. 30, 2025

(30) Foreign Application Priority Data

Jul. 26, 2023　(JP) ................................. 2023-121455

(51) Int. Cl.
　　*G01R 27/26*　　　(2006.01)
　　*G01R 1/04*　　　　(2006.01)
(52) U.S. Cl.
　　CPC ....... *G01R 27/2605* (2013.01); *G01R 1/0408* (2013.01)
(58) Field of Classification Search
　　CPC .......................... G01R 27/2605; G01R 1/0408
　　See application file for complete search history.

(56) References Cited

U.S. PATENT DOCUMENTS

| | | | | |
|---|---|---|---|---|
| 6,549,029 | B1* | 4/2003 | Hsieh | G01R 27/2605 |
| | | | | 324/750.01 |
| 11,774,476 | B2* | 10/2023 | Hirao | G01R 27/2605 |
| | | | | 324/686 |
| 2015/0309109 | A1 | 10/2015 | Tokuno et al. | |
| 2017/0300148 | A1* | 10/2017 | Shimada | G06F 3/041662 |

FOREIGN PATENT DOCUMENTS

JP　　　　2015-210120　A　　11/2015

* cited by examiner

*Primary Examiner* — Reena Aurora
(74) *Attorney, Agent, or Firm* — Studebaker Brackett PLLC

(57) ABSTRACT

To improve the measurement accuracy of feedback capacitance of a semiconductor device. Between a gate terminal of a semiconductor device subject to measurement and an Lc terminal of an LCR meter, a first wiring that is passed through a core of a transformer once and connected between a gate terminal and a source terminal and a second wiring wound N times around a core of the transformer, and one end is connected to the Lc terminal and the other end is grounded are provided. when $\omega$ represents an angular frequency of the AC signal applied to the drain terminal of the semiconductor device, $L_{S\_6A}$ represents inductance of the first wiring, $L_{S\_6B}$ represents inductance of the second wiring, and $C_{GS}$ represents gate-source parasitic capacitance of the semiconductor device, a relationship of $\omega L_{S\_6A} < 1/(\omega C_{GS})$, and $\omega L_{S\_6B}/N^2 < 1/(\omega C_{GS})$ are satisfied.

12 Claims, 13 Drawing Sheets

F I G. 1
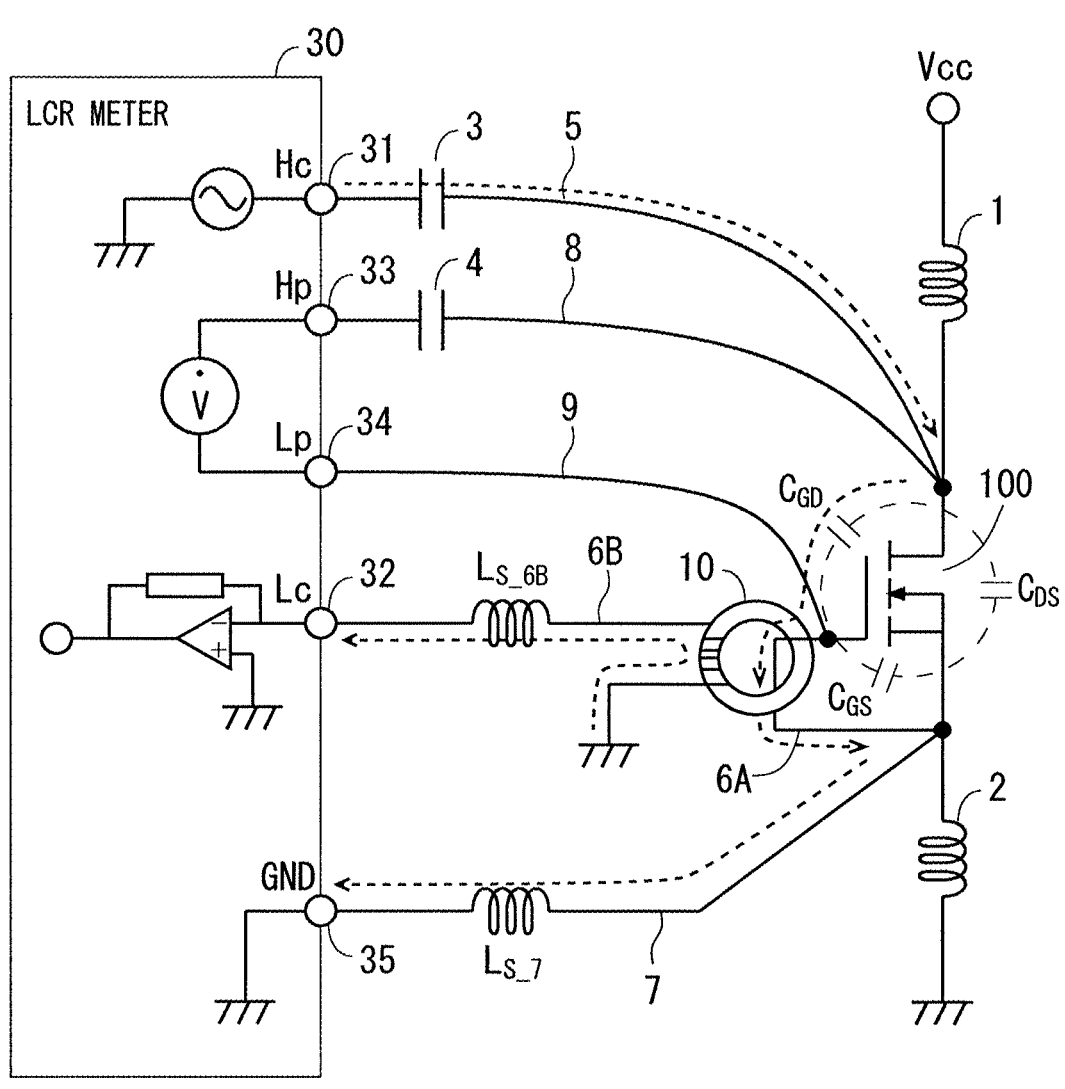

F I G. 2
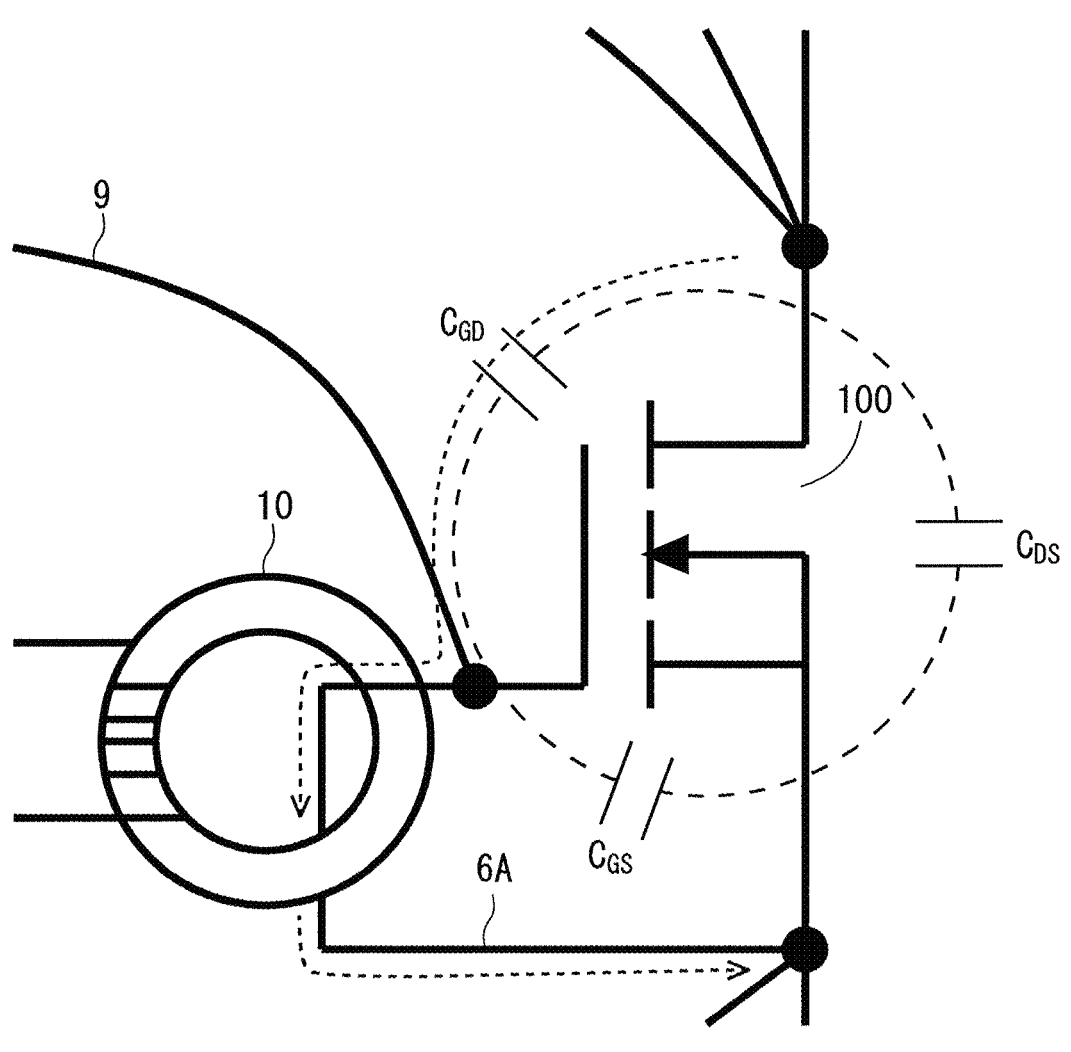

F I G. 3
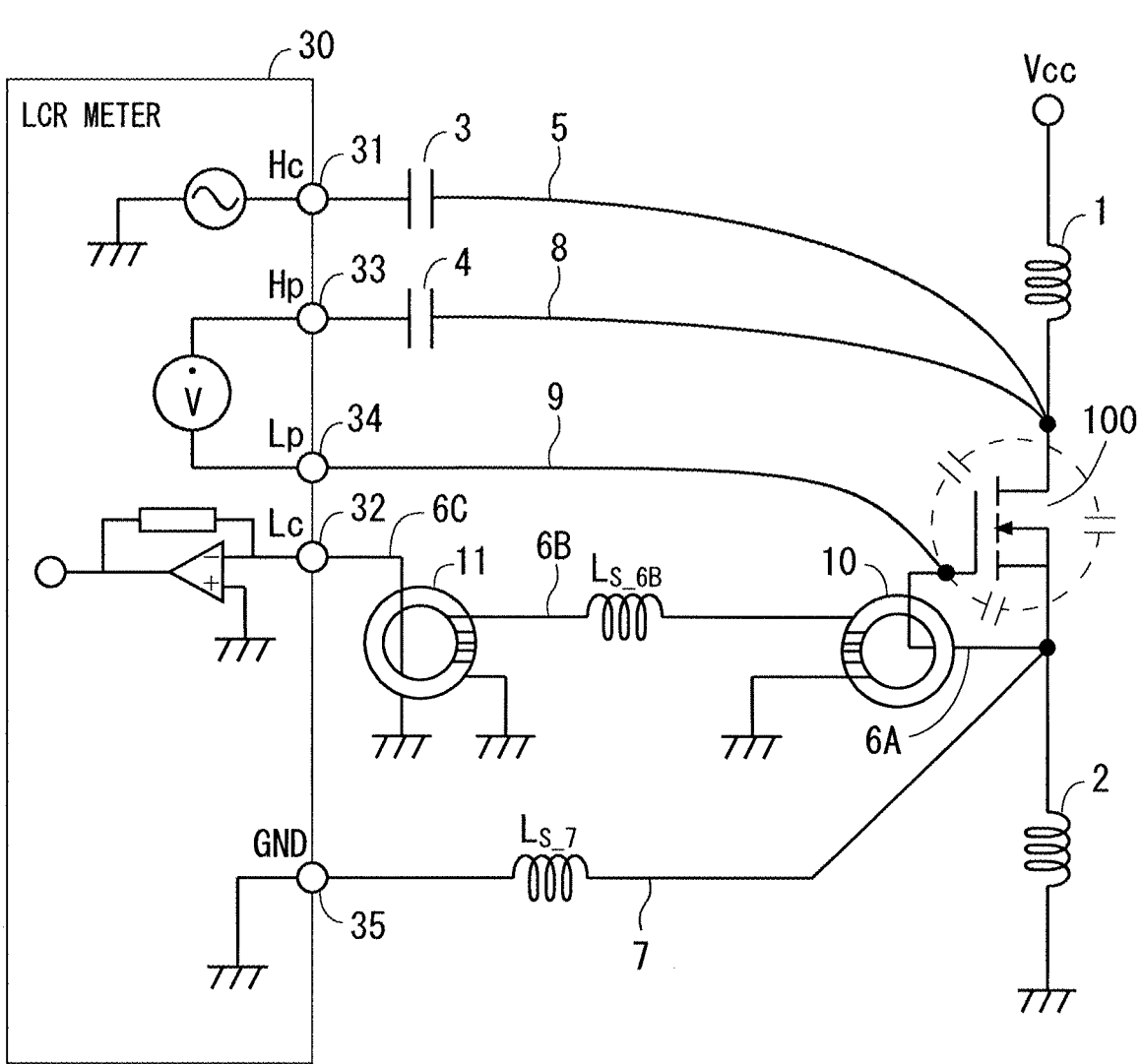

F I G. 4
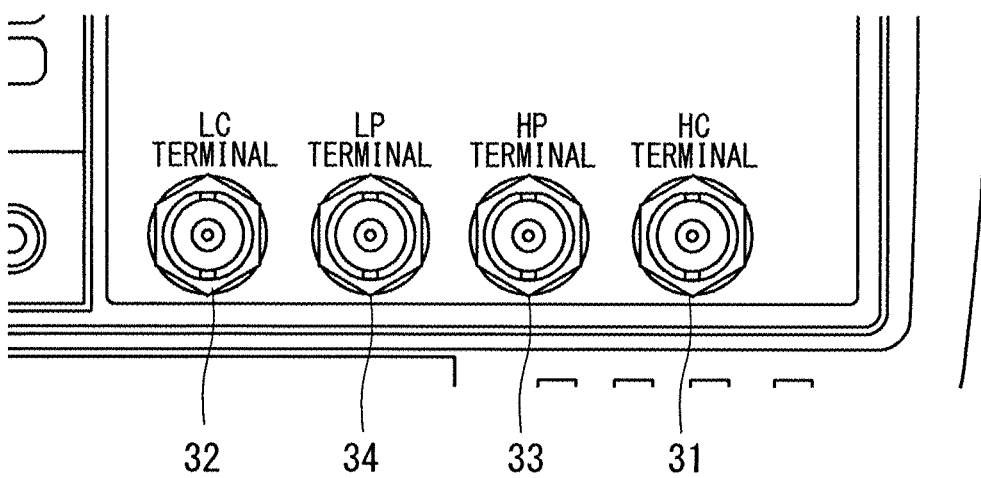

F I G. 5
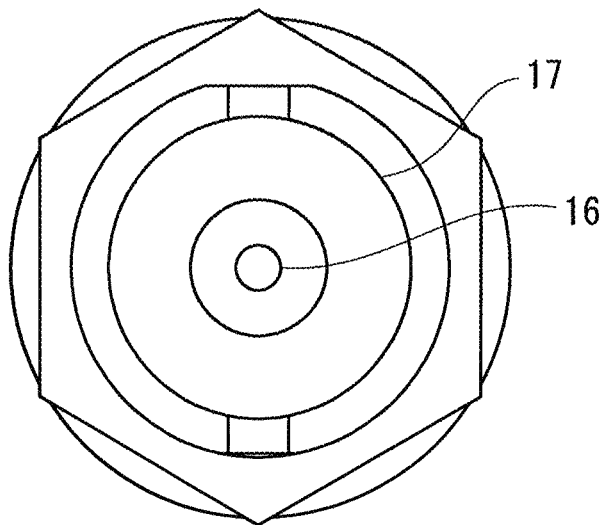

F I G. 6
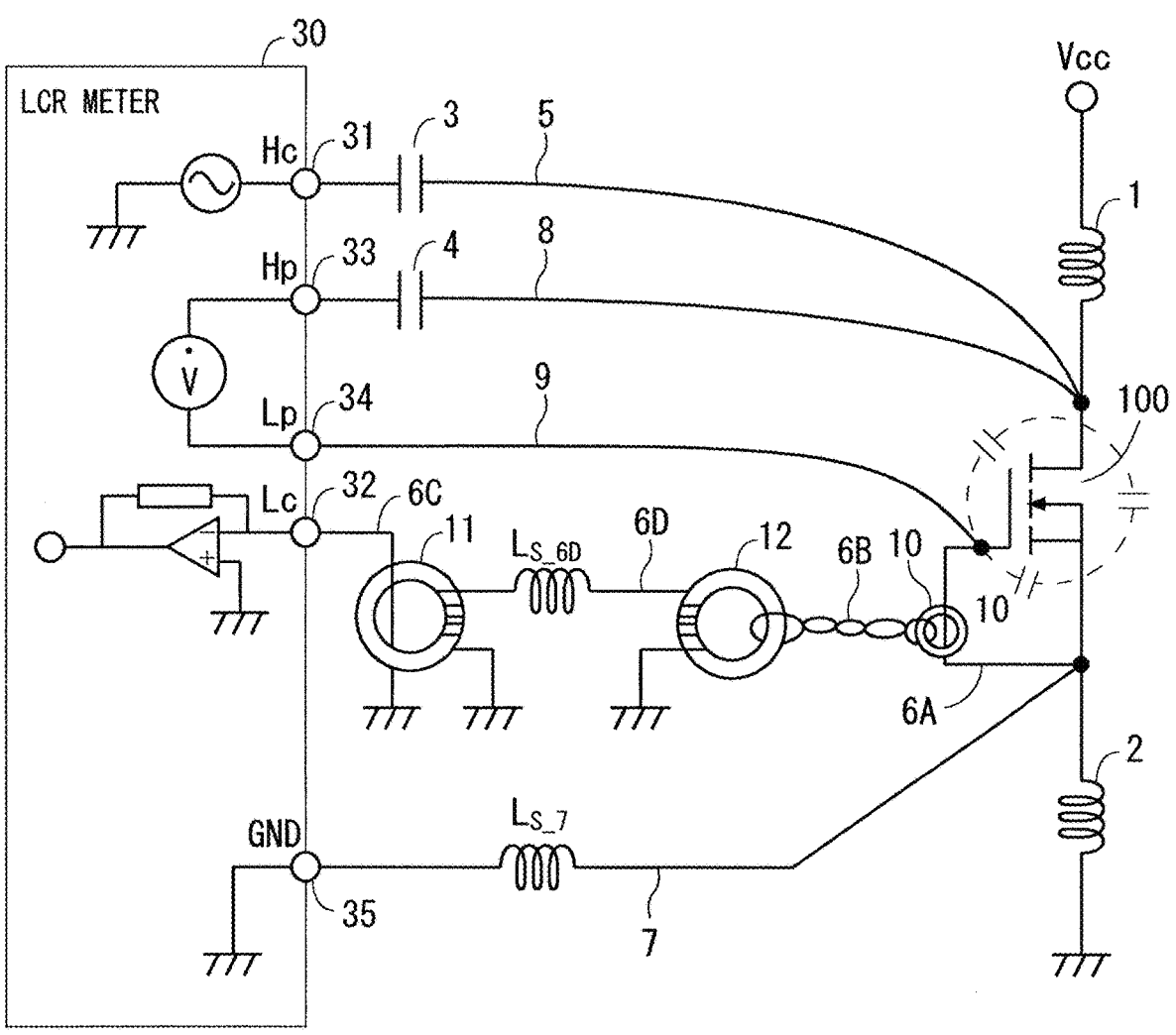

F I G.  7
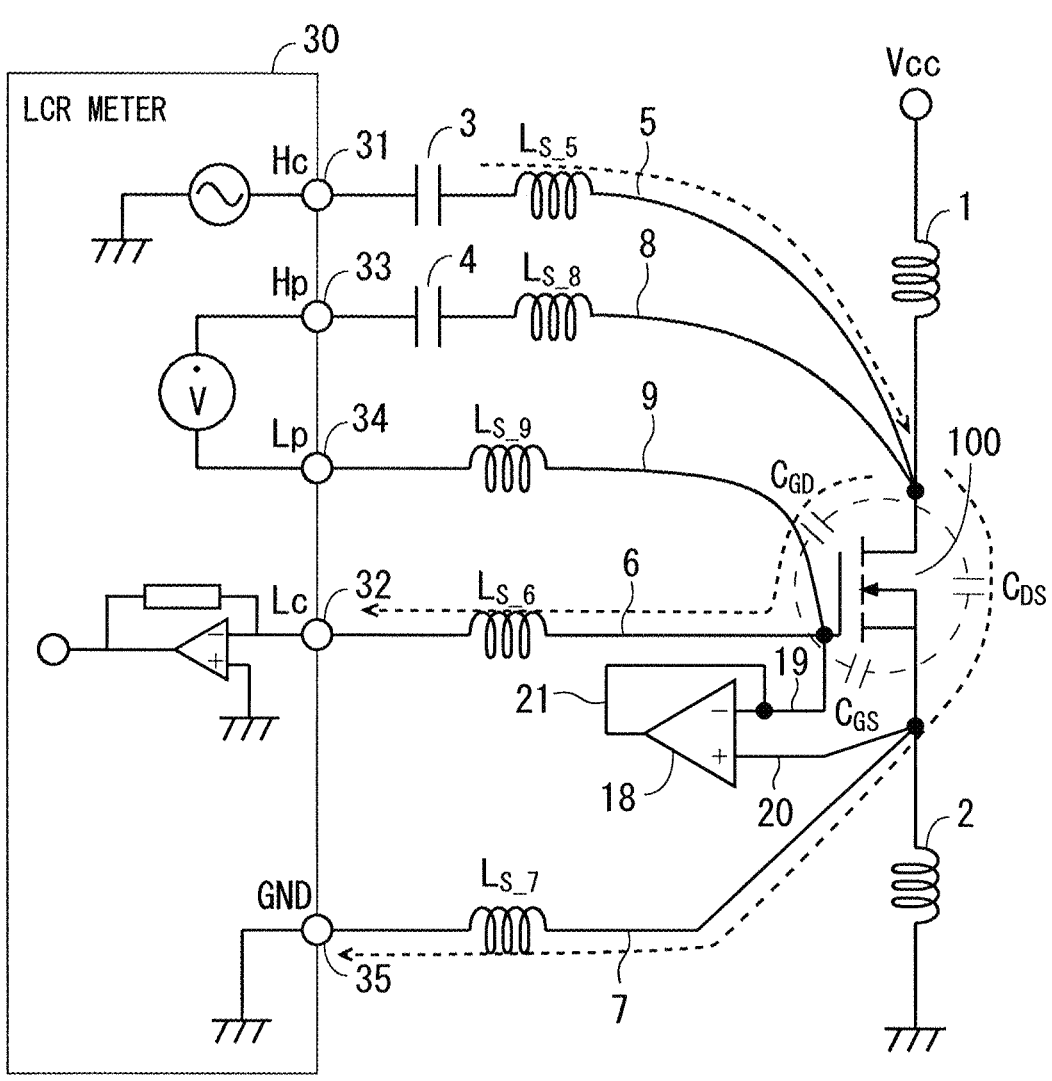

F I G.  8
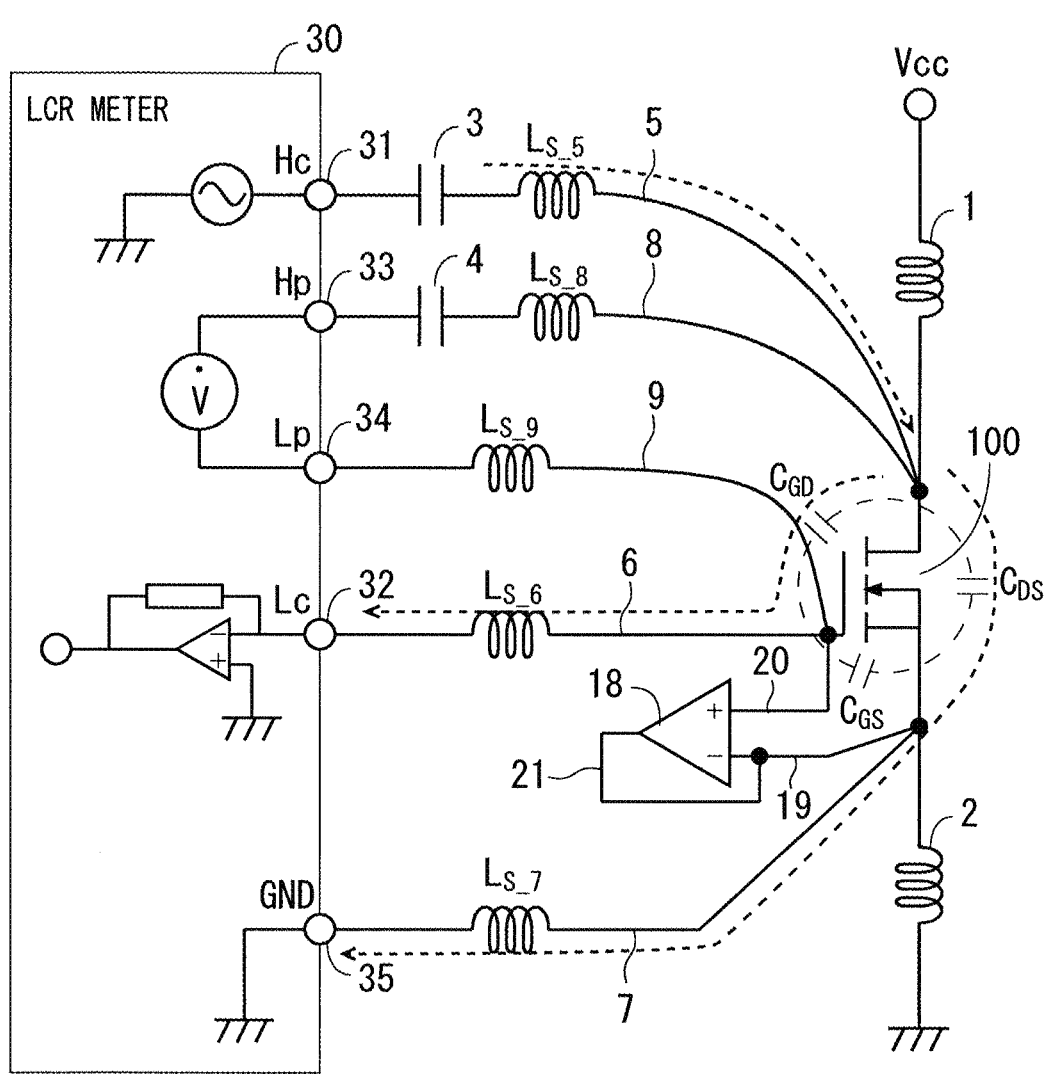

F I G.  9
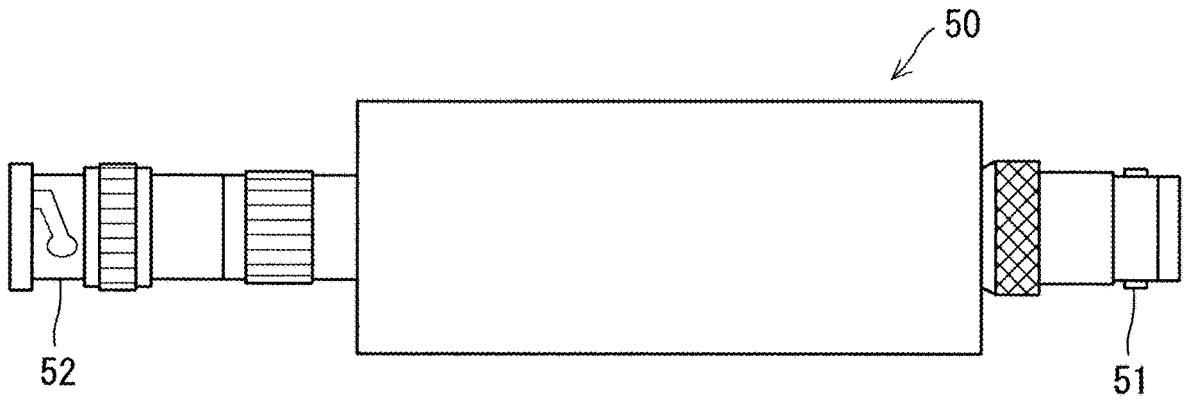

F I G.  1 0
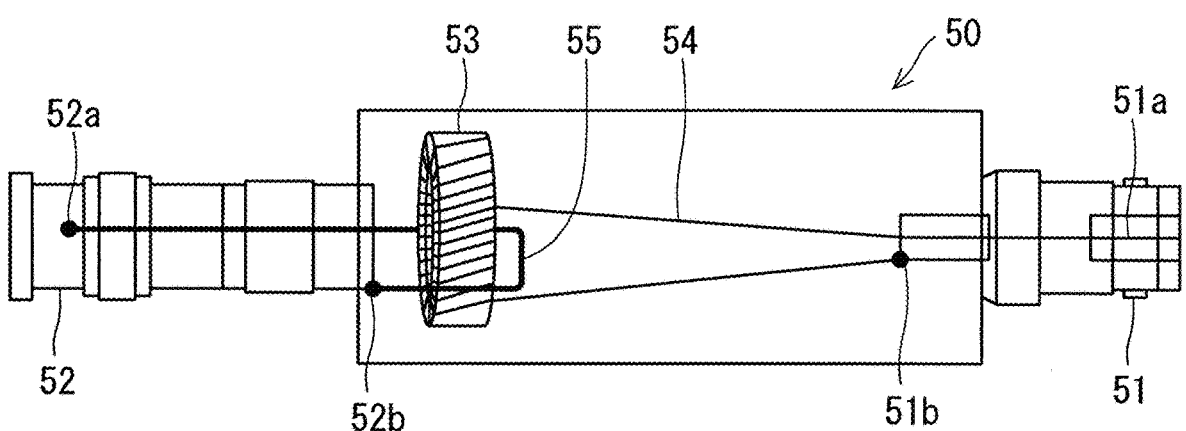

F I G. 1 1
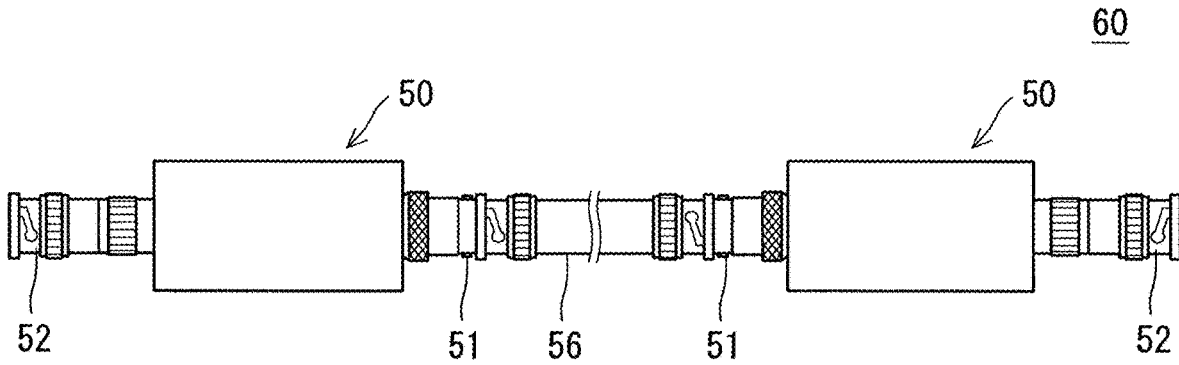

F I G .  1 2
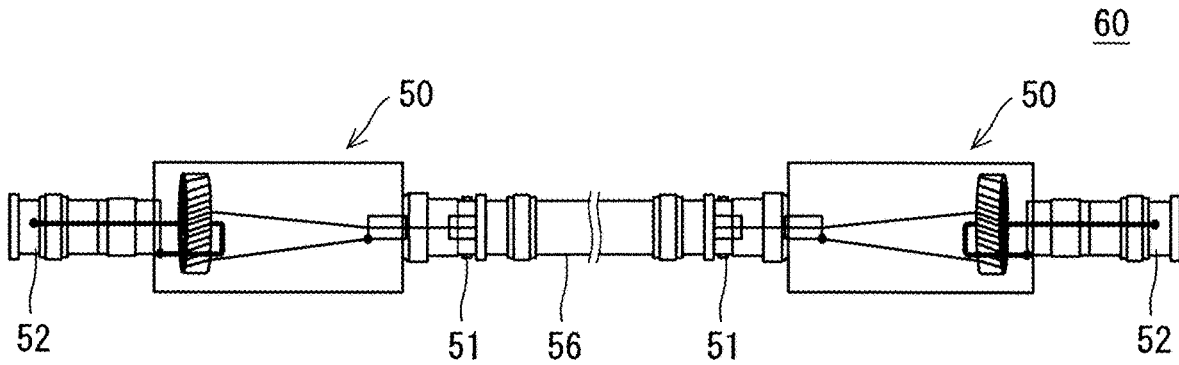

F I G.  1 3
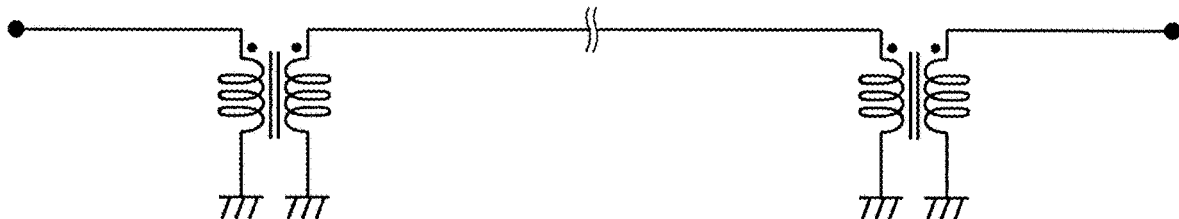

MEASURING DEVICE FOR CAPACITANCE OF SEMICONDUCTOR DEVICE AND MEASUREMENT JIG

BACKGROUND OF THE INVENTION

Field of the Invention

The present disclosure relates to a measuring device for parasitic capacitance of a semiconductor device.

Description of the Background Art

The parasitic capacitance of three-terminal semiconductor devices such as transistors (FET, MOSFET, IGBT, etc.) can be measured using an LCR meter, which is an impedance measuring instrument. Hereinafter, DUT (Device Under Test) refers to the semiconductor device subject to parasitic capacitance measurement.

An LCR meter has an Hour terminal (hereinafter referred to as "Hc terminal") that outputs an Alternating Current (AC) signal, an $L_{cur}$ terminal (hereinafter referred to as "Lc terminal") that monitors current, an $H_{pot}$ terminal (hereinafter referred to as "Hp terminal") and an $L_{pot}$ terminal (hereinafter referred to as "Lp terminal") that monitor voltage, and a GND terminal set to ground potential (GND).

With a high DC voltage VCC being applied between the drain terminal and the source terminal of the DUT, when an AC signal is input from the Hc terminal of the LCR meter to the drain terminal, a current corresponding to the AC signal flows into the drain terminal of the DUT. The current flowing into the drain terminal is divided into the gate and the source within the DUT. The current flowing to the gate of the DUT is input to the Lc terminal of the LCR meter and measured. The source terminal of the DUT is connected to the GND terminal, and the Lc terminal is set to the same potential as the GND terminal (imaginary GND), so no current flows between the gate terminal and the source terminal. Therefore, the current input to the Lc terminal, that is, the current flowing through the gate terminal, is a current ($I_{CGD}$) that passes only through the parasitic capacitance ($C_{GD}$) between the gate and drain of the DUT. Furthermore, the drain terminal and the source terminal of the DUT are connected to the Hp terminal and the Lp terminal of the LCR meter, respectively, and the voltage ($V_{CD}$) between the gate and drain of the DUT is measured by the LCR meter.

The parasitic capacitance $C_{GD}$ between the gate and drain of the DUT, that is, the feedback capacitance ($C_{RSS}$), is calculated from the amplitude and phase of the current $I_{CGD}$ and voltage $V_{CD}$ measured by the LCR meter.

There are two methods for measuring current $I_{CGD}$ and voltage VCD: a two-terminal measurement method in which the current monitor wiring and the voltage monitor wiring connected to the DUT are shared, and a four-terminal measurement method in which they are separated.

The two-terminal measurement method has, on the one hand, the advantage of simplifying the measurement circuit by reducing the number of parts such as a wiring and connectors that comprise the measurement circuit, on the other hand, the disadvantage of low measurement accuracy due to the connector contact resistance, the inductance of the wiring, or the like, affecting measurement values. On the contrary, in the four-terminal measurement method, the effects of the connector contact resistance and the inductance of the wiring can be eliminated, but the measurement circuit is made complicated.

For example, Japanese Patent Application Laid-open No. 2015-210120 below proposes a technique for canceling the effects of the connector contact resistance and the inductance of the wiring in the two-terminal measurement method.

In both the two-terminal measurement method and the four-terminal measurement method, increasing the length of the wiring in the measurement circuit or conducting high-frequency measurements can lead to significant measurement errors. A research found that the cause lies in the wiring inductance ($L_S$) between the gate terminal and the Lc terminal, and the wiring inductance ($L_S$) between the source terminal and the GND terminal (and Guard).

The method for measuring the feedback capacitance $C_{RSS}$ described above is based on the prerequisite that the gate terminal and the source terminal of the DUT are at the same potential (GND potential). In other words, it is assumed that the voltage (wiring drop) that occurs in the wiring inductance between the gate terminal and the Lc terminal and the voltage (wiring drop) that occurs in the wiring inductance between the source terminal and the GND terminal are negligibly small. Therefore, accurate measurements become impossible when these wiring drops become large enough to be ignored.

Therefore, with the current $C_{RSS}$ measurement technique, the lengths of the wiring between the gate terminal and the Lc terminal and the wiring between the source terminal and the GND terminal cannot be made any longer. The above-mentioned problem of wiring drop becomes a bottleneck when having the longer wiring of the measurement circuit is required in the following cases where, when measuring is performed by attaching the DUT to a hot plate or cold plate for temperature setting, for example, when measuring is performed with the DUT connected to another measuring instrument (e.g. DC measuring instrument), also, when it is necessary to increase the distance between the LCR meter and DUT to secure work space, and the like. In addition, when increasing the frequency of the AC signal applied to the DUT, the displacement current due to parasitic capacitance of the DUT increases and the wiring impedance also increases, making the problem of wiring drops even more pronounced.

SUMMARY

An object of the present disclosure is to improve measurement accuracy of feedback capacitance of a semiconductor device (DUT).

A measuring device for capacitance of a semiconductor device according to the present disclosure is a measuring device that measures the capacitance of a three-terminal semiconductor device. The measuring device includes an LCR meter that includes an Hc terminal that outputs an AC signal, an Lc terminal that monitors current, an Hp terminal and an Lp terminal that monitor voltage, and a GND terminal. A drain terminal of the semiconductor device subject to measurement is connected to the Hc terminal and the Hp terminal, a gate terminal of the semiconductor device is connected to the Lp terminal, and a source terminal of the semiconductor device is connected to the GND terminal. The measuring device further includes a first transformer, a first wiring that is passed through a core of the first transformer only once and connected between the gate terminal and the source terminal of the semiconductor device, and a second wiring that is wound N times around the core of the first transformer, one end of which is connected to the Lc terminal, and another end of which is grounded during measurement. when $\omega$ represents an angular frequency of the AC signal, $L_{S\_6A}$ represents inductance of the first wiring, $L_{S\_6B}$ represents inductance of the second wiring, and $C_{GS}$ represents gate-source parasitic capacitance of the semiconductor device, a relationship of $\omega L_{S\_6A} < 1/(\omega C_{GS})$, and $\omega L_{S\_6B}/N^2 < 1/(\omega C_{GS})$ are satisfied.

According to the present disclosure, measurement accuracy of feedback capacitance of a semiconductor device (DUT) is improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram illustrating a circuit configuration of a capacitance measuring device according to Embodiment 1;

FIG. 2 is an enlarged view of the DUT and a first transformer;

FIG. 3 is a diagram illustrating a circuit configuration of a capacitance measuring device according to Embodiment 2;

FIG. 4 is a diagram illustrating measurement terminals of a typical LCR meter;

FIG. 5 is an enlarged view of the female side of a BNC connector;

FIG. 6 is a diagram illustrating a circuit configuration of a capacitance measuring device according to Embodiment 3;

FIG. 7 is a diagram illustrating a circuit configuration of a capacitance measuring device according to Embodiment 4;

FIG. 8 is a diagram illustrating a circuit configuration of a capacitance measuring device according to Embodiment 4;

FIG. 9 is an external view of a measurement jig according to Embodiment 5;

FIG. 10 is a perspective view of the measurement jig according to Embodiment 5;

FIG. 11 is an external view of the measurement jig according to Embodiment 5;

FIG. 12 is a perspective view of the measurement jig according to Embodiment 5; and FIG. 13 is an equivalent circuit diagram of the measurement jig according to Embodiment 5.

DESCRIPTION OF THE PREFERRED EMBODIMENTS

Embodiment 1

FIG. 1 is a diagram illustrating a circuit configuration of a measuring device for capacitance of a semiconductor device (hereinafter referred to as "capacitance measuring device") according to Embodiment 1.

As illustrated in FIG. 1, the capacitance measuring device according to Embodiment 1 includes a first transformer 10 that is one current transformer, two choke coils 1 and 2 that block AC signals, two block capacitors 3, 4, one LCR meter 30, and a plurality of wirings 5, 6A, 6B, 7, 8, and 9 that connect these elements. FIG. 2 illustrates an enlarged view of the DUT 100, being a semiconductor device subject to measurement, and the first transformer 10.

The drain terminal of the DUT 100 is connected to the Vcc power supply via the choke coil 1, is also connected to the Hc terminal 31 of the LCR meter 30 via the block capacitor 3, and is connected to the Hp terminal 33 of the LCR meter 30 via the block capacitor 4. The source terminal of the DUT 100 is connected to the GND terminal via the choke coil 2, and is also connected to the GND terminal 35 of the LCR meter 30 via the wiring 7. Hereinafter, in order to distinguish between the GND terminal to which the choke coil 2 is connected and the GND terminal 35 of the LCR meter 30, the GND terminal to which the choke coil 2 is connected will be referred to as a "power GND terminal".

The gate terminal and the source terminal of DUT 100 are short-circuited by the wiring 6A. The wiring 6A is a primary-side wiring of the first transformer 10 with passing through a hole in the core of the first transformer 10. At this point, shorten the length of the wiring 6A so that the impedance of the wiring 6A is sufficiently lower than the impedance of the gate-source parasitic capacitance ($C_{GS}$) of DUT 100, that is, so that the following equation (1) is satisfied.

$$\omega L_{S\_6A} < 1/(\omega C_{GS}) \qquad (1)$$

In equation (1), $\omega$ represents the angular frequency of the AC signal, $L_{S\_6A}$ represents the inductance of the wiring 6A, and $C_{GS}$ represents the gate-source parasitic capacitance of the DUT 100.

Also, the wiring 6B is wound N times around the core of the first transformer 10 as a secondary-side wiring. One end of the wiring 6B is connected to the Guard, and the other end is connected to the Lc terminal 32 of the LCR meter 30. At this point, the number of turns N of the wiring 6A is increased so that the following equation (2) is satisfied.

$$\omega L_{S\_6B}/N2 < 1/(\omega C_{GS}) \qquad (2)$$

In equation (2), $\omega$ represents the angular frequency of the AC signal, $L_{S\_6B}$ represents the inductance of the wiring 6B, and $C_{GS}$ represents the gate-source parasitic capacitance.

When an AC signal is applied from the Hc terminal 31 of the LCR meter 30 to the drain terminal of the DUT 100, a current according to the AC signal flows into the drain terminal, passes through the gate terminal, passes through the primary-side wiring 6A to flow to the source, flowing into the GND terminal 35 from the source terminal through the wiring 7. Although, the current flowing through the primary-side wiring 6A (primary-side current) generates a magnetic flux inside the core of the first transformer 10, however, in counteraction to this, a current equal to one Nth of the primary-side current (secondary-side current) is generated in the secondary-side wiring 6B. The current flowing through the wiring 6B (secondary-side current) flows into the Lc terminal 32 of the LCR meter 30.

The current flowing into the Lc terminal 32 is 1/N of the current flowing between the gate-drain of the DUT 100, that is, the current flowing through the wiring 6A; therefore, the value of the parasitic capacitance between the gate-drain of the LCR meter 30 (displayed value of the LCR meter 30) is 1/N of the actual value. Therefore, the actual parasitic capacitance $C_{GD}$ between the gate-drain of the DUT 100, that is, the feedback capacitance $C_{RSS}$ can be determined by multiplying the measurement value (displayed value) of the LCR meter 30 by N.

While parasitic impedance is generated also in the secondary-side wiring 6B due to the inductance $L_{S\_6B}$, and the like, the inductance $L_{S\_6B}$ of the secondary-side wiring 6B seen from the primary-side wiring 6A is Reduced to $1/N^2$ due to the effect of the first transformer 10. That is, it is reduced to $1/100$ when the number of turns N of the secondary-side wiring 6B is 10, is reduced to ¹⁄₄₀₀ when the number of turns N thereof is 20, and is reduced to ¹⁄₉₀₀, and when the number of turns N thereof is 30.

Therefore, in the capacitance measuring device according to Embodiment 1, for example, if the number of turns N of the secondary-side wiring 6B is 10 or more, even if the length of the wiring 6B is made 100 times that of the conventional wiring (wiring between the gate terminal and the Lc terminal in conventional measurement method), precision and accuracy equivalent to or higher than the conventional measurement method can be obtained.

Also, when a relay is connected to the wiring 6B to achieve an automatic circuit switching function, for example, while the wiring impedance due to the contact resistance of the relay increases, the effect thereof can be reduced to negligibly small by the effect of the first transformer 10. Further, when the measurement frequency (the frequency of the AC signal) is increased, the impedance ($\omega_{LS\_6B}$) due to the inductance of the wiring 6B increases, however, this effect can also be reduced to negligibly small.

Here, it is conceivable that the current flowing between the gate and the source of the DUT 100 bypasses the parasitic capacitance $C_{GS}$ between the gate and the source in addition to the wiring 6A. However, the impedance of the secondary-side wiring 6B ($\omega L_{S\_6B}/N^2$) and the impedance of the primary-side wiring 6A ($\omega L_{S\_6A}$) seen from the gate terminal and source terminal are negligibly small as compared to the impedance ($1/(\omega C_{GS})$) of the parasitic capacitance $C_{GS}$ between the gate and the source; therefore, the current flowing through the parasitic capacitance $C_{GS}$ can be ignored. In other words, by satisfying equations (1) and (2), it is considered that the current flowing from the drain to the gate of DUT 100 does not flow through the parasitic capacitance $C_{GS}$ with large impedance, but flows only through the primary-side wiring 6A.

Specifically, if "$\omega L_{S\_6A}+\omega L_{S\_6B}/N^2$" is less than 5% of "$1/(\omega C_{GS})$", the measurement error will also be less than 5%, and the accuracy required for measuring the capacitance of a semiconductor device is secured. If this is less than 3%, the measurement error will also be less than 3%, which is more preferable. Further, if this is less than 1% or less than 0.1%, the accuracy with the measurement error being less than 1%, and being less than 0.1% can be secured.

In addition, in the case of conventional measurement methods, when the wiring is long or measurements are performed at high frequencies, the measurement error can exceed 100% due to the potential difference caused between the gate terminal and the source terminal.

Embodiment 2

FIG. 3 is a diagram illustrating a circuit configuration of capacitance measuring device according to Embodiment 2. The configuration of the capacitance measuring device illustrated in FIG. 3 is a configuration in which an additional current transformer is added to the configuration illustrated in FIG. 1. Specific description as follows.

The side of the wiring 6B in FIG. 1 connected to the Lc terminal 32 is removed from the Lc terminal 32, the wiring 6B is wound N times around the core of a second transformer 11, which is an added current transformer, and connected to Guard (or GND). With this, the wiring 6B is to be served as a primary-side wiring of the second transformer 11. That is, one end of the wiring 6B serves as the secondary-side wiring of the first transformer 10, and the other end of the wiring 6B serves as the primary-side wiring of the second transformer 11.

The Lc terminal 32 of the LCR meter 30 is short-circuited to Guard (or GND) using a wiring 6C, and the wiring 6C is passed through the core of the second transformer 11 to serve as the secondary-side wiring of the second transformer 11. At this point, the length of the wiring 6C is shortened such that the impedance of the wiring 6C is sufficiently smaller than the impedance of the parasitic capacitance ($C_{GS}$) between the gate and the source of the DUT 100, that is, such that the following equation (3) is satisfied.

$$\omega L_{S\_6C} < 1/(\omega C_{GS}) \tag{3}$$

In equation (3), $\omega$ represents the angular frequency of the AC signal, $L_{S\_6C}$ represents the inductance of the wiring 6C, and $C_{GS}$ represents the gate-source parasitic capacitance.

In the capacitance measuring device according to Embodiment 2, the current that has been attenuated to 1/N in the first transformer 10 is multiplied by N in the second transformer 11 (that is, returned to the original magnification), and the current flows into the Lc terminal 32 of the LCR meter 30. Therefore, the reevaluation of the measurement value required by the capacitance measuring device of Embodiment 1 (reevaluating the display value by multiplying by N) is not necessary.

Here, short-circuiting between the Lc terminal 32 of the LCR meter 30 and Guard (or GND) is implemented with a short wiring, and the effect of the inductance $L_{S\_6C}$ of the wiring 6C can be reduced to be negligibly small. In other words, the above equation (3) can be satisfied.

For example, FIG. 4 is a diagram illustrating measurement terminals of a typical LCR meter 30. Four terminals, the Hc terminal 31, the Lc terminal 32, the Hp terminal 33, and the Lp terminal 34 are all female (jack) sides of Bayonet Neill-Concelman (BNC) connectors. FIG. 5 illustrates an enlarged view of the female side of the BNC connector (an enlarged view of the Lc terminal 32). The distance between a center contact 16, which is an internal conductor, and a body 17 connected to Guard (or GND) is approximately 5 mm to 7 mm. The center contact 16 and the body 17 of the BNC connector of Lc terminal 32 can be shorted with the wiring 6C, and this wiring 6C can be passed through the core of the second transformer 11 to serve as the secondary-side wiring of the second transformer 11.

In the capacitance measuring device according to Embodiment 2, if "$\omega L_{S\_6A}+\omega L_{S\_6B}/N^2+\omega L_{S\_6C}$" is less than 5% of "$1/(\omega C_{GS})$", the measurement error is less than 5%, and the accuracy required for measuring the capacitance of the semiconductor device is obtained. If this is less than 3%, the measurement error will also be less than 3%, which is more preferable. Further, if this is less than 1% or less than 0.1%, the accuracy with the measurement error being less than 1%, and being less than 0.1% can be secured.

Embodiment 3

FIG. 6 is a diagram illustrating a circuit configuration of a capacitance measuring device according to Embodiment 3. The configuration of the capacitance measuring device illustrated in FIG. 6 is a configuration in which an additional current transformer is further added to the configuration illustrated in FIG. 3. Specific description as follows.

As illustrated in FIG. 6, in the capacitance measuring device according to Embodiment 3, a third transformer 12 is connected between the first transformer 10 and the second transformer 11. The core of the first transformer 10 is relatively smaller than that of the Embodiments 1 and 2. The secondary-side wiring 6B of the first transformer 10 is passed through the core of the first transformer 10 only once. Further, the wiring 6B passes through the core of the third transformer 12 only once, and serves as the primary-side wiring of the third transformer 12. Specifically, the wiring 6B is a ring-shaped wiring that passes through each of the core of the first transformer 10 and the core of the third transformer 12 once. At this point, shorten the length of the wiring 6B so that the impedance of the wiring 6B is sufficiently lower than the impedance of the gate-source parasitic capacitance ($C_{GS}$) of DUT 100, that is, so that the following equation (4) is satisfied.

$$\omega L_{S\_6B} << 1/(\omega C_{GS}) \qquad (4)$$

In equation (4), $\omega$ represents the angular frequency of the AC signal, $L_{S\_6B}$ represents the inductance of the wiring 6B, and $C_{GS}$ represents the gate-source parasitic capacitance of the DUT 100.

A wiring 6D is wound around the core of the third transformer 12 N times and connected to the Guard (or GND). Therefore, one end of the wiring 6A serves as a secondary-side wiring of the third transformer 10. Further, another end of the wiring 6D is wound around the core of the second transformer 11 N times and connected to the Guard (or GND), serving as the primary-side wiring of the second transformer 11.

The number of turns of the wiring 6D around the core of the third transformer 12, as well as the number of turns of the wiring 6D around the core of the second transformer 11, denoted as N, is to be increased so that the following equation (5) is satisfied.

$$\omega L_{S\_6D} \big/ N^2 < 1/(\omega C_{GS}) \qquad (5)$$

In equation (5), $\omega$ represents the angular frequency of the AC signal, $L_{S\_6D}$ represents the inductance of the wiring 6D, and $C_{GS}$ represents the gate-source parasitic capacitance.

When an AC signal is applied to the drain terminal of the DUT 100, a current according to the AC signal flows into the drain terminal, passes through the gate terminal, passes through the primary-side wiring 6A of the first transformer 10 to flow to the source, flowing into the GND terminal 35 from the source terminal through the wiring 7. The current flowing through the primary-side wiring 6A of the first transformer 10 (primary-side current) generates a magnetic flux inside the core of the first transformer 10, however, in counteraction to this, a current that is the same as the primary-side current (secondary-side current) is generated in the secondary-side wiring 6B, serving as the primary-side current of the third transformer 12. Further, the primary-side current flowing through the primary-side wiring 6B of the third transformer 12 generates a magnetic flux inside the core of the third transformer 12, however, in counteraction to this, a secondary-side current that is equal to one Nth of the primary-side current is generated in the secondary-side wiring 6B, serving as the secondary-side current of the second transformer 11.

Then, the current that has been attenuated to 1/N in the third transformer 12 is multiplied by N in the second transformer 11 (that is, returned to the original magnification), and the current flows into the Lc terminal 32 of the LCR meter 30. Therefore, the reevaluation of the measurement value required by the capacitance measuring device of Embodiment 1 (reevaluating the display value by multiplying by N) is not necessary in Embodiment 3 as well.

In Embodiments 1 and 2, the larger the number of turns N of the secondary-side wiring 6B of the first transformer 10, the smaller the effect of the inductance $L_{S\_6B}$ of the wiring 6B, allowing the wiring 6B to be extended. However, in order to increase the number of turns of the secondary-side wiring of the first transformer 10, the dimensions of the core of the first transformer 10 needs to be larger. On the other hand, in order to suppress the inductance $L_{S\_6A}$ of the wiring 6A connecting the gate terminal and the source terminal of the DUT 100, the wiring 6A is preferably as short as possible. To shorten the wiring 6A, the dimensions of the core of the first transformer 10 need to be kept within certain limits. In other words, in Embodiment 1 and Embodiment 2, increasing the number of turns N of the first transformer 10 for the purpose of extending the wiring 6B contradicts the objective of reducing the inductance $L_{S\_6A}$ of the wiring 6A between the gate terminal and the source terminal of DUT 100.

In contrast, in Embodiment 3, the secondary-side wiring 6B of the first transformer 10 is passed through the core of the first transformer 10 only once. Therefore, the dimensions of the core of the first transformer 10 can be kept small, which helps mitigate the effect of the above-mentioned contradiction.

In the capacitance measuring device according to Embodiment 3, if "$\omega L_{S\_6A} + \omega L_{S\_6B} + \omega L_{S\_6D}/N^2 + \omega L_{S\_6C}$" is less than 5% of "$1/(\omega C_{GS})$", the measurement error is less than 5%, and the accuracy required for measuring the capacitance of the semiconductor device is obtained. If this is less than 3%, the measurement error will also be less than 3%, which is more preferable. Further, if this is less than 1% or less than 0.1%, the accuracy with the measurement error being less than 1%, and being less than 0.1% can be secured.

Embodiment 4

FIG. 7 is a diagram illustrating a circuit configuration of a capacitance measuring device according to Embodiment 4.

As illustrated in FIG. 7, the capacitance measuring device according to Embodiment 4 includes two choke coils 1 and 2 that block AC signals, two block capacitors 3 and 4, one LCR meter 30, an operational amplifier 18, and a plurality of wirings 5 to 9 and 19 to 21 that connect these elements.

The drain terminal of the DUT 100 is connected to the Vcc power supply via the choke coil 1, is also connected to the Hc terminal 31 of the LCR meter 30 via the block capacitor 3, and is connected to the Hp terminal 33 of the LCR meter 30 via the block capacitor 4. The gate terminal of the DUT 100 is connected to the Lc terminal 32 of the LCR meter 30 via the wiring 6, and to a negative-side input terminal (inverting input terminal) of the operational amplifier 18 via the wiring 19. The source terminal of the DUT 100 is connected to a power GND terminal via the choke coil 2, and is also connected to the GND terminal 35 of the LCR meter 30 via the wiring 7. In addition, the source terminal of the DUT 100 is connected to the positive (+) side input terminal (non-inverting input terminal) of the operational amplifier 18 via the wiring 20, and the output terminal of the operational amplifier 18 is connected to the negative (−) side input terminal via the wiring 21.

Alternatively, as illustrated in FIG. 8, the gate terminal of DUT 100 may be connected to the positive-side input terminal of the operational amplifier 18 the via the wiring 20, the source terminal of DUT 100 may be connected to the negative-side input terminal of the operational amplifier 18 via the wiring 19, and the output terminal of the operational amplifier 18 may be connected to the negative-side input terminal via the wiring 21. That is, the positive-side input terminal of the operational amplifier 18 may be connected to either the source terminal or the gate terminal of the DUT 100, and the negative-side input terminal of the operational amplifier 18 may be connected to the other of the source terminal or the gate terminal of the DUT 100, and the output terminal of the operational amplifier 18 may be connected to the negative-side input terminal.

When an AC signal is applied from the Hc terminal 31 of the LCR meter 30 to the drain terminal of the DUT 100, a current according to the AC signal flows into the drain terminal and is divided into the gate and the source within the DUT 100. The current flowing toward the gate of the DUT flows through the wiring 6 to the Lc terminal 32, and the current flowing into the source flows through the wiring 7 to the GND terminal 35.

A voltage is generated in the wiring 6 due to the inductance $L_{S\_6}$, and a voltage is also generated in the wiring 7 due to the inductance $L_{S\_7}$. These voltages are prone to generate a potential difference between the gate terminal and the source terminal of the DUT 100, whereas, the positive-side input terminal and the negative-side input terminal of the operational amplifier 18 are at the same potential (imaginary short); therefore, the gate terminal and the source terminal of the DUT 100 are at the same potential. Therefore, no current flows between the gate terminal and the source terminal, and the current ($I_{CGD}$) that passes only through the gate-drain parasitic capacitance ($C_{GD}$) of the DUT 100 flows into the Lc terminal 32 of the LCR meter 30.

Therefore, regardless of the magnitude of the voltages generated in the inductance $L_{S\_6}$ of the wiring 6 and the inductance $L_{S\_7}$ of the wiring 7, the LCR meter 30 can accurately monitor the current $I_{CGD}$ at the Lc terminal 32 and the gate-drain parasitic capacitance $C_{GD}$ of the DUT 100, that is, feedback capacitance $C_{RSS}$, can be measured accurately.

The operational amplifier 18 is desired to have an open-loop gain that does not attenuate even at 10 MHz, in order to be suitable for high-frequency applications. Here, the potential difference between the positive-side input terminal and the negative-side input terminal of the operational amplifier 18, that is, the potential difference between the source terminal and the gate terminal of the DUT 100, directly affects the measurement accuracy of the feedback capacitance $C_{RSS}$. The ratio of the positive-side input voltage (voltage between the positive-side input terminal and the signal GND) to the negative-side input voltage (voltage between the negative-side input terminal and the signal GND) of the operational amplifier 18 is represented by the following equation (6).

$$V_+ / V_- = (1 + 1/A_V) \qquad (6)$$

In the equation (6), $V_+$ represents the positive-side input voltage of the operational amplifier 18, $V_-$ represents the negative-side input voltage of the operational amplifier 18, and Av represents the open-loop gain of the operational amplifier 18.

In the capacitance measuring device according to Embodiment 4, when the open-loop gain AV of the operational amplifier 18 is 20 times or more the potential difference between the positive-side input terminal and the negative-side input terminal, the measurement accuracy of 5% or less, which is the accuracy required for measuring the capacitance of the semiconductor device, is obtained. When this value becomes 100 times, the accuracy becomes 1%, 1000 times results in 0.1%, and 10000 times results in 0.01%.

It is desirable for the operational amplifier 18 to have an Av of 100 times even at 10 Mhz.

Embodiment 5

In Embodiment 5, a measurement jig for configuring a measurement circuit of the capacitance measuring device of Embodiment 2 and Embodiment 3 is illustrated. FIG. 9 is an external view of a measurement jig 50 according to Embodiment 5 and FIG. 10 is a perspective view thereof.

As illustrated in FIG. 10, the measurement jig 50 according to Embodiment 5 includes a jack 51 of a BNC connector, a plug 52 of the BNC connector, a transformer 53 having a core, and wirings 54 and 55.

The wiring 54 is wound N times around the core of the transformer 53, and one end is connected to a center contact 51a, which is a signal terminal of the jack 51, and the other end is connected to a body 51b, which is the Guard of the jack 51. The wiring 55 is passed through the core of the transformer 53 once, and one end is connected to a center contact 52a, which is a signal terminal of the plug 52, and the other end is connected to a body 52b, which is the Guard of the plug 52.

When a current (primary-side current) flows into the center contact 51a of the jack 51, the magnetic flux is generated inside the core of the transformer 53, however, in counteraction to this, the secondary-side current multiplied by N times flows through the wiring 55 into the center contact 16 on the plug 52 side.

The measurement jig 50 according to Embodiment 5 can be used as the core of the second transformer 11 and the secondary-side wiring (wiring 6C) of the second transformer 11 in Embodiment 2 (FIG. 3) and Embodiment 3 (FIG. 6). Specifically, the plug 52 is connected to the Lp terminal 34 of the LCR meter 30, and the body 51b on the jack 51 side is connected to the Guard or GND. In the case of Embodiment 2, the center contact 51a on the jack 51 side is connected to the wiring 6B, and in the case of Embodiment 3, the center contact 51a on the jack 51 side is connected to the wiring 6D.

The use of the measurement jig 50 simplifies wiring work.

Embodiment 6

In Embodiment 6, a measurement jig for configuring a measurement circuit of the capacitance measuring device of Embodiment 2 is illustrated. FIG. 11 is an external view of a measurement jig 60 according to Embodiment 6 and FIG. 12 is a perspective view thereof. FIG. 13 is an equivalent circuit diagram of the measurement jig 60 according to Embodiment 6.

A measurement jig 60 according to Embodiment 6 is obtained by electrically connecting the jacks 51 of the two measurement jigs 50 according to Embodiment 5 with a coaxial cable 56. In equivalent circuit terms, this is a circuit where transformers are connected to both ends of the cable, as illustrated in FIG. 13. The effect of the impedance of the coaxial cable 56 between the two measurement jigs 50 is reduced to $1/N^2$ by the effect of the transformers.

The measurement jig 60 according to Embodiment 6 can be used as the first transformer 10 and the second transformer 11, and the wiring 6B therebetween in Embodiment 2. Specifically, the plug 52 of one of the two measurement jigs 50 constituting the measurement jig 60 according to Embodiment 6 is connected to the Lc terminal 32 of the LCR meter 30, and the center contact and the body of the plug 52 of the other measurement jig 50 are electrically connected to the gate terminal and the source terminal of the DUT 100, respectively.

Embodiment 7

In Embodiment 7, at least one of the following is a litz wire: the primary-side wiring of the first transformer 10 in Embodiment 1 (wiring 6A in FIG. 1); the primary-side wiring of the first transformer 10 and the secondary-side wiring of the second transformer 11 in Embodiment 2 (wiring 6A and wiring 6C in FIG. 3); the primary-side wiring and the secondary-side wiring of the first transformer 10 in Embodiment 3; the primary-side wiring of the second transformer 11; and the secondary-side wiring of the third transformer 12 (wiring 6A, wiring 6B, wiring 6C in FIG. 6). All of these wirings pass through the core of the transformer only once, so even if the wirings become thicker due to the litz wire, there is almost no effect.

The litz wire can suppress an increase in resistance value due to skin effect and proximity effect that occur in high-frequency measurements. In a regular wiring, there is a concern that the impedance of the wiring increases due to the increase in resistance value of the wiring due to skin effect, proximity effect, etc. during high-frequency measurement, leading to an increase in measurement errors. By using the litz wire as the above-mentioned wiring, an increase in resistance value can be suppressed and stable measurement accuracy can be obtained even at high frequencies.

Regarding the secondary-side wiring of the first transformer 10 in Embodiment 1 (wiring 6B in FIG. 1), the secondary-side wiring of the first transformer 10 and the primary-side wiring of the second transformer 11 in Embodiment 2 (wiring 6B in FIG. 3), and the secondary-side wiring of the second transformer 11 and the primary-side wiring of the third transformer 12 (wiring 6D in FIG. 6) in Embodiment 3, while the resistance value of the wiring increases due to the skin effect and the proximity effect due to high frequency, the resistance value can be suppressed to $1/N^2$ due to the effect of the transformer; therefore, there is no effect on measurements even with the regular wiring.

It should be noted that Embodiments can be arbitrarily combined and can be appropriately modified or omitted.

APPENDIX

Hereinafter, the aspects of the present disclosure will be collectively described as Appendices.

Appendix 1

A measuring device configured to measure capacitance of a three-terminal semiconductor device, comprising an LCR meter that includes an Hc terminal that outputs an AC signal, an Lc terminal that monitors current, an Hp terminal and an Lp terminal that monitor voltage, and a GND terminal, wherein
    a drain terminal of the semiconductor device subject to measurement is connected to the Hc terminal and the Hp terminal, a gate terminal of the semiconductor device is connected to the Lp terminal, and
    a source terminal of the semiconductor device is connected to the GND terminal,
the measuring device further comprising:
a first transformer;
a first wiring that is passed through a core of the first transformer only once and connected between the gate terminal and the source terminal of the semiconductor device; and
a second wiring that is wound N times around the core of the first transformer, one end of which is connected to the Lc terminal, and another end of which is grounded during measurement, wherein
when ω represents an angular frequency of the AC signal, $L_{S\_6A}$ represents inductance of the first wiring, $L_{S\_6B}$ represents inductance of the second wiring, and Cos represents gate-source parasitic capacitance of the semiconductor device,
a relationship of $$\omega L_{S\_6A} < 1/(\omega C_{GS}), \text{ and}$$

$$\omega L_{S\_6B}/N^2 < 1/(\omega C_{GS})$$

are satisfied.

Appendix 2

The measuring device for capacitance of the semiconductor device according to Appendix 1, wherein
    $\omega L_{S\_6A} + \omega L_{S\_6B}/N^2$ is less than 5% of $1/(\omega C_{GS})$.

Appendix 3

A measuring device configured to measure capacitance of a three-terminal semiconductor device, comprising an LCR meter that includes an Hc terminal that outputs an AC signal, an Lc terminal that monitors current, an Hp terminal and an Lp terminal that monitor voltage, and a GND terminal, wherein
    a drain terminal of the semiconductor device subject to measurement is connected to the Hc terminal and the Hp terminal,
    a gate terminal of the semiconductor device is connected to the Lp terminal, and
    a source terminal of the semiconductor device is connected to the GND terminal,
the measuring device further comprising:
a first transformer;
a second transformer;
a first wiring that is passed through a core of the first transformer only once and connected between the gate terminal and the source terminal of the semiconductor device;
a second wiring that is wound N times around each of the core of the first transformer and a core of the second transformer, and both ends of which are grounded during measurement; and
a third wiring that passes through the core of the second transformer once, one end of which is connected to the Lc terminal, and another end of which is grounded during measurement, wherein
when ω represents an angular frequency of the AC signal, $L_{S\_6C}$ represents inductance of the third wiring, and $C_{GS}$ represents gate-source parasitic capacitance of the semiconductor device,
a relationship of $L_{S\_6C} < 1/(\omega C_{GS})$ is satisfied.

Appendix 4

The measuring device for capacitance of the semiconductor device according to Appendix 3, wherein
   when $L_{S\_6A}$ represents inductance of the first wiring, and $L_{S\_6B}$ represents inductance of the second wiring, $\omega L_{S\_6A} + \omega L_{S\_6B}/N^2 + \omega L_{S\_6C}$ is less than 5% of $1/(\omega C_{GS})$.

Appendix 5

A measuring device configured to measure capacitance of a three-terminal semiconductor device, comprising an LCR meter that includes an Hc terminal that outputs an AC signal, an Lc terminal that monitors current, an Hp terminal and an Lp terminal that monitor voltage, and a GND terminal, wherein
   a drain terminal of the semiconductor device subject to measurement is connected to the Hc terminal and the Hp terminal,
   a gate terminal of the semiconductor device is connected to the Lp terminal, and
   a source terminal of the semiconductor device is connected to the GND terminal,
   the measuring device further comprising:
   a first transformer;
   a second transformer;
   a third transformer;
   a first wiring that is passed through a core of the first transformer only once and connected between the gate terminal and the source terminal of the semiconductor device;
   a second wiring having a ring-shape passed through each of the core of the first transformer and the core of the second transformer once;
   a third wiring that is wound N times around each of the core of the second transformer and a core of the third transformer, and both ends of which are grounded during measurement; and
   a fourth wiring that passes through the core of the third transformer once, one end of which is connected to the Lc terminal, and another end of which is grounded during measurement, wherein
   when $\omega$ represents an angular frequency of the AC signal, $L_{S\_6B}$ represents inductance of the second wiring, $L_{S\_6D}$ represents inductance of the third wiring, and $C_{GS}$ represents gate-source parasitic capacitance of the semiconductor device,
   a relationship of $\omega L_{S\_6B} \ll 1/(\omega C_{GS})$, and $\omega L_{S\_6D}/N^2 < 1/(\omega C_{GS})$ are satisfied.

Appendix 6

The measuring device for capacitance of the semiconductor device according to Appendix 5, wherein
   when $L_{S\_6A}$ represents inductance of the first wiring, and $L_{S\_6C}$ represents inductance of the fourth wiring, $\omega L_{S\_6A} + \omega L_{S\_6B} + \omega L_{S\_6D}/N^2 + \omega L_{S\_6C}$ is less than 5% of $1/(\omega C_{GS})$.

Appendix 7

The measuring device for capacitance of the semiconductor device according to any one of Appendices 1 to 6, wherein
   at least one of the wirings that is passed through the core of the transformer only once is a litz wire.

Appendix 8

A measuring device configured to measure capacitance of a three-terminal semiconductor device, comprising an LCR meter that includes an Hc terminal that outputs an AC signal, an Lc terminal that monitors current, an Hp terminal and an Lp terminal that monitor voltage, and a GND terminal, wherein
   a drain terminal of the semiconductor device subject to measurement is connected to the Hc terminal and the Hp terminal,
   a gate terminal of the semiconductor device is connected to the Lc terminal and the Lp terminal, and
   a source terminal of the semiconductor device is connected to the GND terminal,
   the measuring device further comprising
   an operational amplifier in which a non-inverting input terminal is connected to one of the source terminal or the gate terminal of the semiconductor device, an inverting input terminal is connected to another of the source terminal or the gate terminal of the semiconductor device, and an output terminal is connected to the inverting input terminal.

Appendix 9

The measuring device for capacitance of the semiconductor device according to Appendix 8, wherein
   an open-loop gain of the operational amplifier is 20 times or more a potential difference between the non-inverting input terminal and the inverting input terminal.

Appendix 10

The measuring device for capacitance of the semiconductor device according to any one of Appendices 1 to 9, wherein
   the drain terminal of the semiconductor device is connected to a power supply via a first choke coil, to the Hc terminal via a first block capacitor, and to the HP terminal via a second block capacitor, respectively, and
   the source terminal of the semiconductor device is grounded via a second choke coil.

Appendix 11

A measurement jig comprising:
   a plug and a jack of a BNC connector;
   a transformer;
   a first wiring wound N times around a core of the transformer, one end is connected to a first center contact which is a signal terminal of the jack, and another end is connected to a first body which is a guard of the jack, and
   a second wiring passed through the core of the transformer only once, one end is connected to a second center contact which is a signal terminal of the plug, and another end is connected to a second body which is a guard of the plug.

US 12,674,829 B2

Appendix 12

A measurement jig comprising:
two measurement jigs according to Appendix 11; and
a coaxial cable connecting the jacks of the two measuring jigs.
While the invention has been illustrated and described in detail, the foregoing description is in all aspects illustrative and not restrictive. It is therefore understood that numerous modifications and variations can be devised without departing from the scope of the invention.

What is claimed is:
1. A measuring device configured to measure capacitance of a three-terminal semiconductor device, comprising an LCR meter that includes an Hc terminal that outputs an AC signal, an Lc terminal that monitors current, an Hp terminal and an Lp terminal that monitor voltage, and a GND terminal, wherein
a drain terminal of the semiconductor device subject to measurement is connected to the Hc terminal and the Hp terminal,
a gate terminal of the semiconductor device is connected to the Lp terminal, and
a source terminal of the semiconductor device is con- nected to the GND terminal, the measuring device further comprising:
a first transformer;
a first wiring that is passed through a core of the first transformer only once and connected between the gate terminal and the source terminal of the semiconductor device; and
a second wiring that is wound N times around the core of the first transformer, one end of which is connected to the Lc terminal, and another end of which is grounded during measurement, wherein when ω represents an angular frequency of the AC signal, $L_{S\_6A}$ represents inductance of the first wiring, $L_{S\_6B}$ represents inductance of the second wiring, and Cos represents gate-source parasitic capacitance of the semiconductor device, a relationship of

$\omega L_{S\_6A} < 1/(\omega C_{GS})$, and $\omega L_{S\_6B}/N^2 < 1/(\omega C_{GS})$ are satisfied.
2. The measuring device for capacitance of the semicon- ductor device according to claim 1, wherein
$\omega L_{S\_6A} + \omega L_{S\_6B}/N^2$ is less than 5% of $1/(\omega C_{GS})$.
3. The measuring device for capacitance of the semiconductor device according to claim 1, wherein
at least one of the wirings that is passed through the core of the transformer only once is a litz wire.
4. The measuring device for capacitance of the semicon- ductor device according to claim 1, wherein the drain terminal of the semiconductor device is con- nected to a power supply via a first choke coil, to the Hc terminal via a first block capacitor, and to the HP terminal via a second block capacitor, respectively, and
the source terminal of the semiconductor device is grounded via a second choke coil.
5. A measuring device configured to measure capacitance of a three-terminal semiconductor device, comprising an LCR meter that includes an Hc terminal that outputs an AC signal, an Lc terminal that monitors current, an Hp terminal and an Lp terminal that monitor voltage, and a GND terminal, wherein a drain terminal of the semiconductor device subject to measurement is connected to the Hc terminal and the Hp terminal,
a gate terminal of the semiconductor device is connected to the Lp terminal, and
a source terminal of the semiconductor device is con- nected to the GND terminal,
the measuring device further comprising:
a first transformer;
a second transformer;
a first wiring that is passed through a core of the first transformer only once and connected between the gate terminal and the source terminal of the semiconductor device;
a second wiring that is wound N times around each of the core of the first transformer and a core of the second transformer, and both ends of which are grounded during measurement; and
a third wiring that passes through the core of the second transformer once, one end of which is connected to the Lc terminal, and another end of which is grounded during measurement, wherein
when ω represents an angular frequency of the AC signal, $L_{S\_6C}$ represents inductance of the third wiring, and $C_{GS}$ represents gate-source parasitic capacitance of the semiconductor device,
a relationship of $L_{S\_6C} < 1/(\omega C_{GS})$ is satisfied.
6. The measuring device for capacitance of the semicon- ductor device according to claim 5, wherein
when $L_{S\_6A}$ represents inductance of the first wiring, and $L_{S\_6B}$ represents inductance of the second wiring, $\omega L_{S\_6A} + \omega L_{S\_6B}/N^2 + \omega L_{S\_6C}$ is less than 5% of $1/(\omega C_{GS})$.
7. The measuring device for capacitance of the semicon- ductor device according to claim 5, wherein
at least one of the wirings that is passed through the core of the transformer only once is a litz wire.
8. The measuring device for capacitance of the semicon- ductor device according to claim 5, wherein
the drain terminal of the semiconductor device is con- nected to a power supply via a first choke coil, to the Hc terminal via a first block capacitor, and to the HP terminal via a second block capacitor, respectively, and
the source terminal of the semiconductor device is grounded via a second choke coil.
9. A measuring device configured to measure capacitance of a three-terminal semiconductor device, comprising an LCR meter that includes an Hc terminal that outputs an AC signal, an Lc terminal that monitors current, an Hp terminal and an Lp terminal that monitor voltage, and a GND terminal, wherein
a drain terminal of the semiconductor device subject to measurement is connected to the Hc terminal and the Hp terminal,
a gate terminal of the semiconductor device is connected to the Lp terminal, and
a source terminal of the semiconductor device is con- nected to the GND terminal,
the measuring device further comprising:
a first transformer;
a second transformer;
a third transformer;

a first wiring that is passed through a core of the first transformer only once and connected between the gate terminal and the source terminal of the semiconductor device;

a second wiring having a ring-shape passed through each of the core of the first transformer and the core of the second transformer once;

a third wiring that is wound N times around each of the core of the second transformer and a core of the third transformer, and both ends of which are grounded during measurement; and a fourth wiring that passes through the core of the third transformer once, one end of which is connected to the Lc terminal, and another end of which is grounded during measurement, wherein when $\omega$ represents an angular frequency of the AC signal, $L_{S\_6B}$ represents inductance of the second wiring, $L_{S\_6D}$ represents inductance of the third wiring, and Cos represents gate-source parasitic capacitance of the semiconductor device, a relationship of $$\omega L_{S\_6B} \ll 1/(\omega C_{GS}), \text{ and}$$

$$\omega L_{S\_6D}/N^2 < 1/(\omega C_{GS})$$

are satisfied.

10. The measuring device for capacitance of the semiconductor device according to claim 9, wherein when $L_{S\_6A}$ represents inductance of the first wiring, and $L_{S\_6C}$ represents inductance of the fourth wiring, $\omega L_{S\_6A} + \omega L_{S\_6B} + \omega L_{S\_6D}/N^2 + \omega L_{S\_6C}$ is less than 5% of $1/(\omega C_{GS})$.

11. The measuring device for capacitance of the semiconductor device according to claim 9, wherein at least one of the wirings that is passed through the core of the transformer only once is a litz wire.

12. The measuring device for capacitance of the semiconductor device according to claim 9, wherein the drain terminal of the semiconductor device is connected to a power supply via a first choke coil, to the Hc terminal via a first block capacitor, and to the HP terminal via a second block capacitor, respectively, and the source terminal of the semiconductor device is grounded via a second choke coil.

\* \* \* \* \*